United States Patent [19]
Gossmann et al.

[11] Patent Number: 6,153,920
[45] Date of Patent: Nov. 28, 2000

[54] PROCESS FOR CONTROLLING DOPANT DIFFUSION IN A SEMICONDUCTOR LAYER AND SEMICONDUCTOR DEVICE FORMED THEREBY

[75] Inventors: Hans-Joachim Ludwig Gossmann; Conor Stefan Rafferty, both of Summit, N.J.

[73] Assignee: Lucent Technologies Inc., Murray Hill, N.J.

[21] Appl. No.: 09/015,981

[22] Filed: Jan. 30, 1998

Related U.S. Application Data

[63] Continuation-in-part of application No. 08/862,226, May 23, 1997, Pat. No. 5,731,626, which is a continuation of application No. 08/348,013, Dec. 1, 1994.

[51] Int. Cl.[7] .................... H01L 29/167
[52] U.S. Cl. .............. 257/607; 257/65; 257/66; 257/610; 257/611; 257/612; 257/652
[58] Field of Search .................. 257/607, 610, 257/612, 651, 77, 611, 345, 75, 652, 66; 438/495, 510, 511, 528

[56] References Cited

U.S. PATENT DOCUMENTS

| | | | |
|---|---|---|---|
| 5,116,455 | 5/1992 | Daly ........................... | 156/605 |
| 5,338,945 | 8/1994 | Baliga et al. ................. | 257/77 |
| 5,731,626 | 3/1998 | Eagleshame et al. .......... | 257/607 |
| 6,043,139 | 3/2000 | Eaglesham et al. ............ | 438/495 |

OTHER PUBLICATIONS

"Suppression of Oxidation–Enhanced Boron Diffusion in Silicon by Carbon Implantation and Characterization of MOSFET's with Carbon–Implanted Channels", by Ban, I. et al., *IEEE Transactions on Electron Devices*, vol. 44, No. 9 pp. 1544–1551 (Sep. 1997).

"Dislocation Formation and B Transient Diffusion in C Coimplanted Si", by Cacciato, A. et al., *J. Appl. Phys.*, 79(5) pp. 2314–2325 (Mar. 1, 1996).

"Effects of Low Dose Silicon, Carbon, and Oxygen Implantation Damage on Diffusion of Phosphorous in Silicon", by Chaudhry, S. et al., *J. Electrochem. Soc.*, vol. 141, No. 12, pp. 3516–3521 (Dec. 1994).

"Reduction of Transient Boron Diffusion in Preamorphized Si by Carbon Implantation", by Nishikawa, S. et al., *Appl. Phys. Lett.*, 60 (18), pp. 2270–2272 (May 4, 1992).

"Role of C and B Clusters in Transient Diffusion of B in Silicon", by Cowern, N. E. B. et al., *Appl. Phys. Lett.*, 68 (8), pp. 1150–1152 (Nov. 6, 1995).

"Suppression of Dislocation Formation in Silicon by Carbon Implantation", by Simpson, T. W. et al., *Appl. Phys. Lett.*, pp. 2857–2859 (Nov. 6, 1995).

*Primary Examiner*—Donald L. Monin, Jr.
*Assistant Examiner*—Alonzo Chambliss
*Attorney, Agent, or Firm*—Richard J. Botos

[57] ABSTRACT

A semiconductor device having a carbon-containing region with an advantageous concentration profile is disclosed. The carbon is introduced into a region of the substrate and at a depth below the space-charge layer of the device and at a concentration such that the carbon atoms absorb point defects created in the substrate during device fabrication but do not adversely affect the leakage characteristics of the device.

3 Claims, 1 Drawing Sheet

PROCESS FOR CONTROLLING DOPANT DIFFUSION IN A SEMICONDUCTOR LAYER AND SEMICONDUCTOR DEVICE FORMED THEREBY

CONTINUING APPLICATION DATA

This application is a continuation-in-part of U.S. Ser. No. 08/862,226, filed May 23, 1997 now U.S. Pat. No. 5,731,626, which is a continuation of U.S. Ser. No. 08/348,013, filed on Dec. 1, 1994, which are hereby incorporated by reference.

TECHNICAL FIELD

This invention relates to a process for controlling the diffusion of ion-implanted dopant atoms in a semiconductor layer and to the semiconductor device formed thereby.

BACKGROUND OF THE INVENTION

Semiconductor devices such as field effect transistors (FETs) have a source region, and a drain region formed in a semiconductor substrate and a gate formed over the channel region. The source and drain are formed in a semiconductor substrate by introducing impurities (dopants) into the substrate. The semiconductor body separates the source region and the drain region. The dopants used to form the source and drain regions are of a different polarity (n-type or p-type) than the semiconductor substrate body surrounding the source and drain regions. Consequently, substantially no current will pass from the source to the semiconductor body or from the drain to the semiconductor body.

There is a space-charge layer which separates both the source region from the semiconductor body and the drain region from the semiconductor body. Current flows from source to drain across the body (through a region of the body referred to as the channel) under the influence of the gate. When the gate is below a certain voltage, called the threshold voltage, very little current flows from the source to the drain and the device is off. When the gate voltage is above the threshold voltage, a greater amount of current flows from the source to the drain and the device is on.

It is advantageous if individual FETs have the same threshold voltage as other FETs, irrespective of the length of a gate in a particular device. However, the threshold voltage of the device is determined by the doping profile in the body, the doping of the gate, as well as the thickness of the gate insulator (i.e. the thickness of the layer of insulating material on which the gate is formed). Of these factors, only the doping profile is affected by the gate length. This is due to the fact that doping the source and the drain has an effect on the region of the body adjacent the source and the drain (the channel region of the device).

The usual method of introducing dopant atoms which is controllable, reproducible and free from most undesirable side effects is ion implantation. During ion implantation, dopant atoms are ionized, accelerated and directed at a silicon substrate. They enter the crystal lattice of the silicon substrate, collide with silicon atoms and gradually lose energy, finally coming to rest at some depth within the lattice. The average depth can be controlled by adjusting the acceleration energy. The dopant dose can be controlled by monitoring the ion current during implantation. The principal side effect—disruption of the silicon lattice caused by ion collisions—is removed by subsequent heat treatment, i.e., annealing. Annealing is required to repair lattice damage and place dopant atoms on substitutional sites within the silicon substrate where they will be electrically active. Rapid thermal annealing is a term that covers various methods of heating wafers for short periods of time, e.g., 100 seconds, which enable almost complete electrical activation with diffusion of dopant atoms occurring within what had been previously regarded as tolerable limits.

However, during the anneal, damage from the ion implantation process, in the form of point defects, migrates laterally from the source and/or drain and into the semiconductor body and enhances dopant diffusion. This enhanced diffusion, known as transient enhanced diffusion (TED) changes the carefully tailored profile in the body of the device.

Transient enhanced diffusion occurs during post-implant annealing and arises from the fact that the diffusion of dopant atoms, particularly boron (B) and phosphorus (P), is undesirably enhanced by excess silicon (Si) self-interstitials generated by the implant. The generation of excess Si self-interstitials by the implant also leads to a phenomenon herein referred to as dynamic clustering whereby implanted dopant atoms form clusters or agglomerates in a semiconductor layer. These clusters or agglomerates are immobile and electrically inactive. Whereas in the past TED and dynamic clustering were not issues which overly concerned device manufacturers, TED and dynamic clustering now threaten to impose severe limitations on the minimum device dimensions attainable in future silicon device technologies.

The effect that TED will have on the threshold voltage of the device is related to the gate length. Specifically, the longer the gate length, the less the effect of TED on the threshold voltage of the device. This is because the effects of TED are within a certain distance of the source and drain. When the gate length is long, the effect of TED is not a function of gate length, and minor differences in gate length do not cause corresponding variations in the threshold voltage of the devices. When the gate length is shorter, the effects of TED from both the source and the drain begin to overlap. These overlapping TED effects cause a change in the threshold voltage in the device that is gate-length dependent. Consequently, variations in gate length from device to device result in variations of threshold voltage and other electrical parameters from device to device. Since the design rules for FET devices are getting progressively smaller, i.e., 0.5 $\mu$m to 0.35 $\mu$m to 0.25 $\mu$m to 0.18 $\mu$m, the need to suppress the effects of TED is increasing.

Recent investigations have been aimed at untangling the mechanisms of dopant diffusion in order to provide a sound basis for simulation programs designed to predict dopant diffusion during device processing. An additional challenge is the development of processing-compatible methods of controlling the diffusion of dopant atoms.

Recently, S. Nishikawa, A. Tanaka and T. Yamaji, Appl. Phys. Lett. 60, 2270 (1992), reported that dopant diffusion can be reduced when carbon (C) is co-implanted with boron into a silicon substrate. This reduction has been attributed to the fact that the implanted carbon provides a sink for excess interstitials during annealing. However, the presence of carbon in certain regions of the substrate has been observed to cause current to leak into the substrate. Accordingly, if carbon is to be useful as a solution to the diffusion of dopants into the substrate from the source and the drain, the current leakage caused by the presence of carbon in the substrate must be reduced.

SUMMARY OF THE INVENTION

The diffusion of ion-implanted dopant atoms, e.g., boron, phosphorous, arsenic, etc., in a deposited semiconductor layer is controlled by the process which comprises incorporating a diffusion-suppressing amount of carbon in the semiconductor substrate. The concentration of dopant in the semiconductor substrate is controlled in relation to the device formed on the semiconductor substrate.

Specifically, in the device of the present invention, carbon is introduced into a region of the substrate such that the concentration of carbon atoms in the space-charge layer of the device is less than $1 \times 10^{18}$ cm$^{-3}$. The space-charge layer of a device is the region in the device where the electron-hole pairs recombine. One skilled in the art will appreciate that the dimensions of the space-charge layer depend upon the operating conditions of the device such as the maximum voltage across the junction. As used herein, space-charge layer refers to the space-charge region of a device as defined by the conditions under which the device is operated.

Furthermore, the peak concentration of the carbon atoms in the region of the substrate other than the space-charge layer is at least $5 \times 10^{18}$ cm$^{-3}$ and that peak concentration must be present in the substrate a certain distance from the interface between the silicon substrate and the overlying gate dielectric material. That distance is less than about four times the depth of the source/drain regions. The depth of the source/drain regions is also referred to herein as the junction depth.

Carbon is incorporated in the semiconductor layer by either growth or by implantation. In the growth technique, at least one species comprising the carbon is added to the crystal growth flux used to form a layer of silicon on a silicon substrate. Conventional crystal growth techniques such as chemical vapor deposition and molecular beam epitaxy are contemplated as suitable. For example, a carbon-containing gas can be added to the crystal growth flux during the chemical vapor deposition of an epitaxial silicon layer.

In a second embodiment of the present invention, the carbon is introduced into the substrate by ion implantation. Implantation conditions that are required to introduce the carbon into the substrate at the desired location and in the desired concentration are readily ascertained by those skilled in the art.

After the carbon is introduced into the substrate, the substrate is annealed. The annealing temperature is about 900° C. to about 1200° C. It is advantageous if the annealing temperature is about 950° C. to about 1100° C. The substrate is annealed for at least about ten seconds in order for the desired effect on the diffusion of the subsequently implanted dopants to be observed.

After the carbon implant/substrate anneal, dopants are implanted into the substrate to form the source and drains regions of the desired device. The source and drain implants are performed using conditions well known to one skilled in the art and which will not be discussed in detail herein. The diffusion of these dopants, and other dopants such as channel dopants, is advantageously affected by the presence of the carbon previously introduced into the substrate.

The phrase "semiconductor layer" as utilized herein shall be understood to refer to any layer which is selectively or uniformly grown on a substrate by a crystal growth technique. Examples of such semiconductor layers include epitaxial silicon, polycrystalline silicon, and silicon-germanium.

The term "diffusion" herein shall be understood to include both transient enhanced diffusion (TED) and dynamic clustering.

The phrase "crystal growth technique" herein is utilized in its broadest sense and shall therefore be understood to be inclusive of all techniques which can be employed to grow materials on a substrate. Techniques which therefore can be employed herein include chemical vapor deposition (CVD), molecular beam epitaxy, reactive magnetron sputtering, and the like.

DETAILED DESCRIPTION

Figure 1:
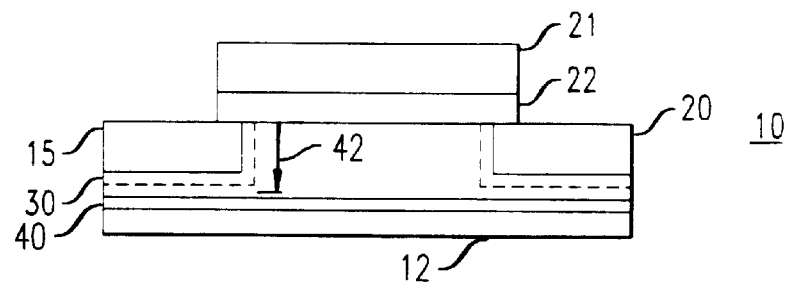
FIG. 1 is a schematic illustration of an (MOS) field effect transistor (FET)

One example of a semiconductor MOSFET device is illustrated schematically in FIG. 1. That device 10 has a source region 15 and a drain region 20 formed in a silicon substrate 12. The gate 21 is formed on a gate insulator layer 22 which is formed on the silicon substrate 12. The space-charge layer 30 associated with the source region 15 and the drain region 20, while not a discrete, identifiable region in the substrate, is illustrated by the dashed line in FIG. 1. As previously noted, the space-charge layer is a function of the operating conditions. Based upon the operating conditions, the dimensions of the space-charge layer are readily ascertained by one skilled in the art.

The device has a carbon-containing region 40 which has a carbon concentration that is at least $5 \times 10^{18}$ atoms/cm$^3$. The region is located at a depth in the substrate 12 that does not exceed about four times the depth of the source region 15 or the drain region 20 in the substrate. Also, the concentration profile of the carbon is such that the concentration of carbon in the space-charge layer 30 does not exceed about $1 \times 10^{18}$/cm$^{-3}$.

The semiconductor material in which the carbon is introduced is either a semiconductor substrate or a semiconductor layer containing carbon incorporated therein formed on a semiconductor substrate by a chemical vapor deposition (CVD) technique as disclosed in B. Jayant Baliga, ed., "Epitaxial Silicon Technology", Academic Press (1986).

Chemical vapor deposition typically involves decomposing gaseous mixtures of a silicon-containing gas or gases on a substrate at a temperature which usually ranges from about 100° C. to about 1300° C., preferably from about 800° C. to about 1200° C., and a pressure which usually ranges from about atmospheric to about 10 mTorr. The substrate on which the semiconductor layer is grown can be a silicon wafer which is typically prepared by the Czochralski technique. The wafer can possess any suitable orientation such as an (100), (110) or (111) orientation and can be heavily or lightly doped with impurity atoms as is well known in the art. Background electrical doping of the semiconductor layer can be achieved by adding, for instance, traces of a suitable dopant atom-containing gas, e.g., diborane ($B_2H_6$) or phosphine ($PH_3$), to the gaseous mixture. Any suitable silicon-containing gas or mixture thereof can be employed during CVD such as silane ($SiH_4$), disilane ($Si_2H_6$), dichlorosilane ($SiH_2Cl_2$), trichlorosilane ($SiHCl_3$), silicon tetrachloride ($SiCl_4$), and the like.

In accordance with the present invention, after the epitaxial growth process has been initiated, e.g., by introducing a silicon-containing gas into a hot-wall or cold-wall CVD chamber to provide a crystal growth flux, a species to be incorporated within the epitaxially grown layer of silicon, i.e., the carbon, is added to the crystal growth flux in the CVD chamber. The phrase "crystal growth flux" as utilized herein shall be understood to refer to the species supplied to the silicon substrate in order to establish crystal growth. Carbon will occupy substitutional sites within the crystal lattice structure of the epitaxial silicon layer. A carbon-containing gas or mixture of carbon-containing gases is added to the crystal growth flux during the chemical vapor deposition of an epitaxial silicon layer to thereby incorporate substitutional carbon within the deposited epitaxial silicon layer. The presence of substitutional carbon within such an epitaxial silicon layer has been demonstrated to be an effective means of controlling the diffusion, i.e., the transient enhanced diffusion and dynamic clustering, of subsequently ion-implanted dopant atoms. One skilled in the art will be readily able to control the epitaxial growth so that the carbon concentration does not exceed about $1\times10^{18}/cm^3$ in the space charge layer and wherein the peak carbon concentration of at least about $5\times10^{18}/cm^3$ is a distance from the surface of the substrate that does not exceed about four times the junction depth.

Various carbon-containing gases and/or mixtures thereof can be employed in the process herein, including hydrocarbons such as methane ($CH_4$), ethylene ($C_2H_4$), acetylene ($C_2H_2$) and silacyclobutane ($C_3H_6SiH_2$). The hydrocarbons employed herein should be of high purity, i.e., ULSI grade.

The addition of the carbon-containing gas to the crystal growth flux during an epitaxial growth process is accomplished by adding the carbon-containing gas to the gas flow entering the CVD chamber. The flow rate of the gases entering the CVD chamber, including the carbon-containing gas, can broadly range from about 1 standard cubic centimeter per minute (sccm) to about 10 standard liters per minute (slpm). Preferably, substitutional carbon is incorporated in the deposited epitaxial silicon layer at a level, expressed in terms of concentration, which is at least about $5\times10^{18}C/cm^3$ at a depth below the interface between the substrate and the gate dielectric layer overlying the substrate that does not exceed about four times the junction depth. Furthermore, the concentration of carbon in the space charge layer is less than about $1\times10^{18}/cm^3$. The concentration of substitutional carbon incorporated in the epitaxial silicon layer can be controlled, of course, by controlling the amount of carbon-containing gas which is added to the gas flow during the epitaxial growth process. The amount of carbon-containing gas or gases added to the gas flow during CVD is largely dependent on the reactivity of the particular carbon-containing gas being employed. For example, acetylene has been found to be more reactive under MBE conditions than ethylene. Thus, ethylene might be employed in greater amounts relative to acetylene. Suitable gases and amounts to be employed can be readily determined by routine experimentation. Ordinarily, the ratio of the carbon-containing gas to the silicon-containing gas will range from about 1:1 to about 1:10,000, with ratios ranging from about 1:100 to about 1:1000 being common. The amount of substitutional carbon which is incorporated in the semiconductor layer can therefore be closely controlled.

In a second embodiment of the present invention, the desired carbon concentration profile is obtained by ion implantation. In this embodiment the implant conditions are tailored to obtain a profile in which the concentration of carbon atoms in the silicon substrate is at least about $5\times10^{18}/cm^3$ at a depth in the substrate that does not exceed about four times the junction depth. For purposes of the present invention, the junction depth is the distance between the substrate surface (the substrate being the semiconductor substrate in which the various device layers are formed) and the bottom of the junction (i.e. the bottom of the source/drain regions). Also, the concentration of the carbon does not exceed about $1\times10^{18}/cm^3$ either in the source or drain regions or the space charge regions adjacent to the source and drain regions of the junction. After implantation, the substrate is annealed. One skilled in the art will appreciate that anneals are performed at a variety of temperatures and are generally characterized as either high temperature anneals or low temperature anneals. If a high temperature anneal is used temperatures greater than 900° C. but less than about 1200° C. are contemplated as suitable. The annealing conditions are selected to remove the damage caused by the carbon implant and to activate the carbon. The effect of the annealing conditions on the diffusion of boron is illustrated by the following example 1.

EXAMPLE 1

Silicon substrates having a 20 nm wide boron spike with a concentration of $1\times10^{19}/cm^3$ were prepared by low temperature molecular beam epitaxial growth on Si(100) substrates. Carbon was implanted into silicon substrates at the energies and at the dose summarized in table 1 below. The carbon implants were subsequently annealed at two temperatures, 1050° C. for 10 seconds and 800° C. for 54 minutes, in flowing Argon.

Silicon was then implanted (30 KeV at a dose of $5\times10^{13}/cm^2$) and the substrate was annealed for 35 minutes at 800° C. in Argon to imitate the transient diffusion which can occur during processing. Specifically, the silicon implant and anneal simulates a source/drain implant plus spacer deposition and anneal in terms of the damage created by the implant and the amount of that damage that is subsequently removed by the anneal. Boron concentration and the depth profile of the boron spike were measured using SIMS, and the diffusion of the boron in the substrates was thereby determined. The transient displacement of the boron at the various carbon implant and annealing conditions are summarized in Table 1 below.

TABLE 1

| | Transient Displacement of Boron During Final Anneal | |
|---|---|---|
| Carbon Implant Conditions | When Carbon Is Pre-Annealed at 1050° C. | When Carbon Is Pre-Annealed at 800° C. |
| 150 KeV, $1\times10^{14}/cm^2$ | 21.1 nm | 29.7 nm |
| 100 KeV, $1\times10^{14}/cm^2$ | 16.3 nm | 27.6 nm |
| 150 KeV, $3\times10^{14}/cm^2$ | 21 nm | 30.1 nm |
| none | 26.9 nm (no anneal) | |

Table 1 illustrates that the amount of diffusion without any carbon was 26.9 nm after the low temperature anneal. That diffusion was reduced significantly by the carbon implant followed by an anneal at 1050° C. Diffusion actually increased when the carbon implant was followed by an 800° C. anneal. Therefore, the degree to which diffusion is controlled by the carbon implant depends upon the temperature at which the substrate is annealed after the carbon implant.

Exemplary conditions for an implant that provides the desired carbon concentration profile for a device in which the edge of the space-charged layer is 0.1 μm below the surface of the substrate are enumerated in the following Table 2.

TABLE 2

| Carbon Dose | Carbon Implant Energy (KeV) | | | | | |
|---|---|---|---|---|---|---|
| ($1 \times 10^{14}/cm^2$) | 50 | 70 | 100 | 120 | 150 | 200 |
| 0.5 | too high | too low | too low | too low | too low | too deep |
| 1 | too high | too high | adequate | adequate | adequate | too deep |
| 1.5 | too high | too high | adequate | adequate | adequate | too deep |
| 2 | too high | too high | adequate | adequate | adequate | too deep |
| 3 | too high | too high | too high | adequate | adequate | too deep |
| 5 | too high | too high | too high | too high | adequate | too deep |
| 7 | too high | too high | too high | too high | adequate | too deep |
| 9 | too high | too high | too high | too high | too high | too high |

Table 2 indicates which conditions provided the desired result. These conditions are indicated as "adequate." The conditions indicated as "too high" provided a carbon concentration that was too high. The conditions indicated as "too low" provided a carbon concentration that was too low. The conditions indicated as "too deep" provided a carbon peak concentration that was too deep. As indicated by table 2, implant dosages in the range of about $1 \times 10^{14}$ atoms/cm$^2$ to about $7 \times 10^{14}$ atoms/cm$^2$ and implant energies in the range of about 100 KeV to about 150 KeV are contemplated as suitable carbon implant conditions for devices in which the edge of the space-charge layer is 0.1 $\mu$m below the surface of the substrate.

One skilled in the art will be able to select suitable carbon implant conditions that provide the specified carbon concentration at the necessary depth in the substrate to satisfy the specified relationship between the carbon concentration and the depth of the space-charge layer for other devices.

Various microelectronic devices can thus be fabricated at the semiconductor layer in accordance with known methods. Examples of such devices include MOS-type devices, e.g., n-MOS, p-MOS and CMOS devices, thin film transistors, heterojunction devices, and the like.

Figure 2:
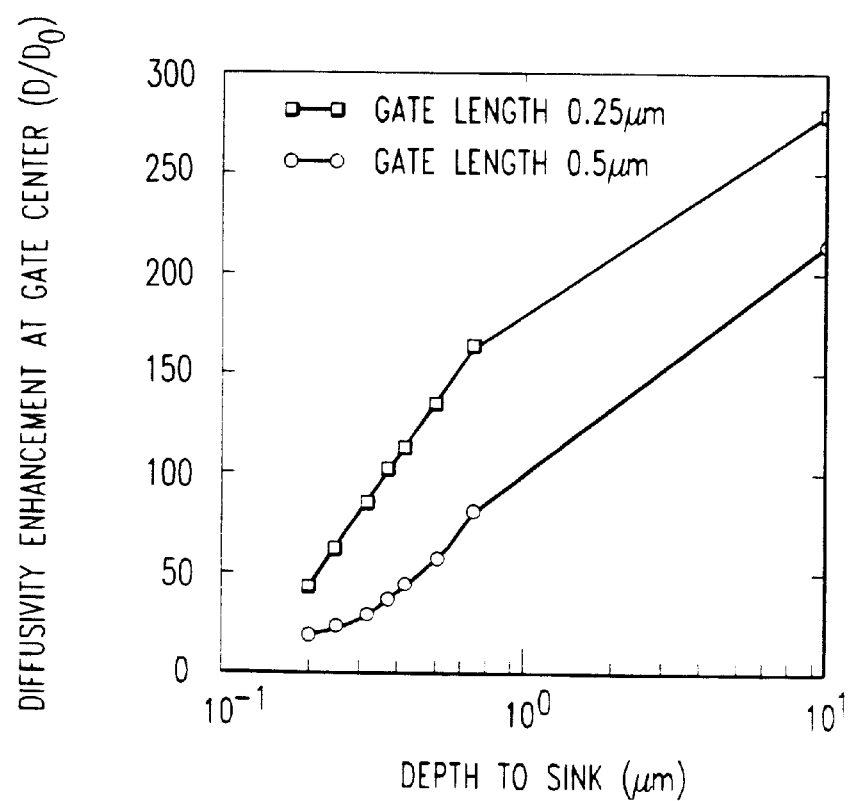
FIG. 2 graphically illustrates that the presence of carbon in the substrate reduces dopant diffusion, and that the placement of the peak carbon concentration relative to the surface effects the degree to which the dopant diffusion is reduced.

FIG. 2 illustrates the effect of the depth of the carbon implant in the substrate on the diffusivity of the dopants in the substrate. In the context of this discussion, depth is the distance from the substrate surface to the peak concentration of the carbon distribution. This depth is indicated by the arrow, 42, in FIG. 1. Referring to FIG. 2, $D_0$ is the diffusivity of channel dopants in the substrate before dopants are introduced into the source and drain and D is the channel diffusivity after the dopants are introduced. D is measured at the center of the channel at the point where the local channel diffusivity is most enhanced. The enhancement in channel diffusivity $D/D_0$ due to source/drain dopants is substantially mitigated by the introduction of a carbon layer below the junctions. As illustrated in FIG. 2, the benefit provided by the carbon layer decreased as the depth of the carbon layer in the substrate increased.

The data depicted in FIG. 2 was obtained by simulating the relationship between the depth of the dopant profile and the diffusivity enhancement for devices with a gate length of 0.25 $\mu$m and 0.5 $\mu$m. As illustrated in FIG. 2, the benefit of the carbon implant was proportionally greater for the 0.5 $\mu$m gate length device than for the 0.25 $\mu$m gate length device. This indicates that the degree of beneficial effect from the carbon implant is a function of channel length. That is, all other things being equal, a device with a longer channel will exhibit a greater degree of beneficial effect from the carbon implant than a device with a shorter channel.

What is claimed is:

1. A semiconductor device comprising source and drain regions formed in a semiconductor substrate and a gate formed on the semiconductor substrate between the source and drain regions, wherein the source and drain regions have associated therewith a charge separation layer, wherein the semiconductor substrate has a region that contains carbon atoms in a concentration of at least $5 \times 10^{18}/cm^3$ at a depth in the substrate that does not exceed about four times the depth of the source and drain regions in the substrate and wherein the concentration of the carbon does not exceed about $1 \times 10^{18}/cm^3$ in the source region, the drain region, and the space charge region of the device and wherein the carbon-containing region underlies the source region, the drain region and the gate region of the device.

2. The semiconductor device of claim 1 wherein the device is selected from the group consisting of an MOS device, a thin-film device, and a heterojunction device.

3. The semiconductor device of claim 2 wherein the semiconductor substrate is selected from the group consisting of silicon, and silicon-germanium.

* * * * *